United States Patent [19]

Nakagawa

[11] Patent Number: 5,004,927
[45] Date of Patent: Apr. 2, 1991

[54] PROCESS FOR FORMING A FINE PATTERN HAVING A HIGH ASPECT RATIO

[75] Inventor: Kenji Nakagawa, Isehara, Japan

[73] Assignee: Fujitsu Limited, Kawasaki, Japan

[21] Appl. No.: 529,744

[22] Filed: May 25, 1990

Related U.S. Application Data

[63] Continuation of Ser. No. 282,505, Dec. 12, 1988, abandoned.

[30] Foreign Application Priority Data

Dec. 10, 1987 [JP] Japan .................................. 62-314761

[51] Int. Cl.⁵ .................... H01J 37/302; H01J 37/304
[52] U.S. Cl. .................................. 250/492.2; 250/309
[58] Field of Search ............... 250/309, 492.21, 492.22

[56] References Cited

U.S. PATENT DOCUMENTS

| | | | |
|---|---|---|---|
| 4,503,329 | 3/1985 | Yamaguchi et al. | 250/492.21 |
| 4,609,809 | 9/1986 | Yamaguchi et al. | 250/492.21 |
| 4,874,947 | 10/1989 | Ward et al. | 250/492.21 |
| 4,908,226 | 3/1990 | Kubena et al. | 250/492.21 |

FOREIGN PATENT DOCUMENTS 61-123843 6/1986 Japan .
61-190941 8/1986 Japan .
62-195662 8/1987 Japan .
86/02774 5/1986 World Int. Prop. O. .

OTHER PUBLICATIONS

Cambria, T. D. et al., "Mask and Circuit Repair with Focused-Ion Beams", Solid State Technology, vol. 30, No. 9, Sep. 1987, Port Washington, NY, pp. 133-136.

H. Betz & A. Heuberger "Influence of Sputter Effects on the Resolution in X-Ray Mask Repair", (SPIE, vol. 632, pp. 67-75, 1986).

Y. Ochiai, S. Matsui & K. Mori "Focused Ion Beam Technology", (Solid State Technology, pp. 75-78, Nov. 1987).

Primary Examiner—Bruce C. Anderson
Attorney, Agent, or Firm—Staas & Halsey

[57] ABSTRACT

A fine pattern having a high aspect ratio is precisely formed using a focused-ion beam system by depositing a pattern, detecting an image of the deposited pattern, comparing the image of the deposited pattern to data for a pattern to be formed, depositing again, if necessary, to form a portion of the deposited to be formed but omitted from the deposited pattern, and removing an excess portion of the deposited pattern or the further deposited portion.

20 Claims, 5 Drawing Sheets

PROCESS FOR FORMING A FINE PATTERN HAVING A HIGH ASPECT RATIO

CROSS-REFERENCE TO RELATED APPLICATION

This application is a continuation of application Ser. No. 07/282,505 filed Dec. 12, 1988, now abandoned.

BACKGROUND OF THE INVENTION

1. Field of the Invention

The present invention relates to a process for forming a fine pattern. More specifically, the present invention relates to a process for forming a fine pattern, such as that of an X-ray mask or a wiring of an integrated circuit, which requires a high aspect ratio, by a focused-ion beam (FIB) technology.

2. Description of the Related Art

X-ray lithography, in which an X-ray resist is exposed and developed with an X-ray having a wavelength of several angstroms, is suitable for forming a fine pattern because an X-ray has a short wavelength and does not cause diffraction or interference.

FIG. 1 shows a cross section of an X-ray mask 1, in which a membrane 4 of silicon carbide (SiC) is superimposed on a silicon wafer 3, which in turn, is superimposed on a glass ring 2, and patterns 5 of an X-ray absorbing material of, for example, gold or tungsten (hereinafter referred to as "heavy metal or the like.") are formed on the membrane 4. The X-ray absorbing material patterns 5 are generally formed by electron beam scanning, sputter etching, etc., but recently an ion beam assisted deposition is also partly utilized, in which a film of a heavy metal, or the like, is selectively formed at required location by a focused ion beam technology. In the ion beam assisted deposition, a reaction gas is adsorbed on a surface of a sample, for example, the above-mentioned membrane 4, to which an ion beam is accelerated at an energy of 20 –30 keV and selectively irradiated or scanned to deposit a metal film only at the selectively irradiated portions. For example, tungsten hexacarbonyl $W(CO)_6$ is used as the reaction gas to deposit tungsten. Alternatively, other metals may be deposited by changing the reaction gas. The ion beam assisted deposition deposits films having a fineness depending on a diameter of the ion beam, for example, 0.1 $\mu$m or less, and therefore, is suitable for forming or modifying an X-ray mask for which fine patterns are required. Such a fine pattern also may be required for the wiring of integrated circuit devices, and the ion beam assisted deposition is also suitable for forming such wiring, more specifically, for modifying the wiring of an integrated circuit.

In the ion beam assisted deposition, films or patterns are formed by irradiating an ion beam while adsorbing a reaction gas on a sample. The irradiated ion beam causes a deposition of a metal near the desired patterns or the irradiated portion by heat, etc., generated by the irradiation of the ion beam, resulting in a gradual slope along the edge of the patterns. This causes a problem of a low aspect ratio, particularly in an X-ray mask or wiring that requires a fine pattern having a width of 0.1 to 0.5 $\mu$m and a thickness of 0.5 to 1.0 $\mu$m.

The present invention is intended to remove the above problems and to provide a fine pattern having a high aspect ratio by ion beam assisted deposition.

Japanese Unexamined Patent Publication (Kokai) No. 62-195662, published on Aug. 28, 1987, discloses a process for forming a pattern by ion beam assisted deposition followed by removing an excess portion of the deposited pattern with ion beam etching. This is directed to the same object of the present invention but utilizes a different solution.

In Japanese Unexamined Patent Publication (Kokai) No. 61-123843, published on June 11, 1986, M. Satoh et al disclose an ion beam assisted deposition in which a density of the irradiated ion beam is regulated by controlling an amount or a power of the ion beam irradiation in accordance with an area to be irradiated.

SUMMARY OF THE INVENTION

The present invention provides a process for forming a fine pattern by a focused-ion beam (FIB) system, comprising the steps of: mounting a sample in the FIB system; and scanning an ion beam on the sample while supplying a reaction gas over the sample at a first scanning condition to deposit a material from the reaction gas onto the sample, the material deposited forming a first pattern; scanning an ion beam at least near a periphery of the pattern at a second scanning condition to acquire an image of the pattern; comparing the acquired image of the pattern with a desired pattern to detect an excess portion of the pattern which should be removed; and scanning an ion beam on the excess portion of the pattern at a third scanning condition to remove same.

In another aspect of the present invention, there is also provided a process for forming a fine pattern by a focused-ion beam (FIB) system, comprising the steps of: mounting a sample including a substrate and a first pattern on the substrate in the FIB system, the first pattern having a first portion whereat a material is to be deposited; scanning an ion beam on the first portion while supplying a reaction gas over the sample at a first scanning condition to deposit the material on the first portion of the sample, the deposited material forming a second pattern together with the first pattern; scanning an ion beam at least near a periphery of the second pattern at a second scanning condition to acquire an image of the second pattern; comparing the acquired image of the second pattern with a desired pattern to detect an excess portion of the second pattern which should be removed; and scanning an ion beam on the excess portion of the second pattern at a third scanning condition to remove at least a part thereof.

Also, according to the present invention, there is provided a process for forming a fine pattern by a focused-ion beam (FIB) system, comprising the steps of: mounting a sample including a substrate and a first pattern on the substrate in the FIB system, the first pattern having a first portion which is to be removed; scanning an ion beam on the first pattern at a first scanning condition to acquire an image of the first pattern; comparing the acquired image of the first pattern with a desired pattern of the first pattern to detect the first portion of the first pattern; and scanning an ion beam on the first portion of the first pattern at a second scanning condition to remove same.

DESCRIPTION OF THE PREFERRED EMBODIMENTS

Figure 2:
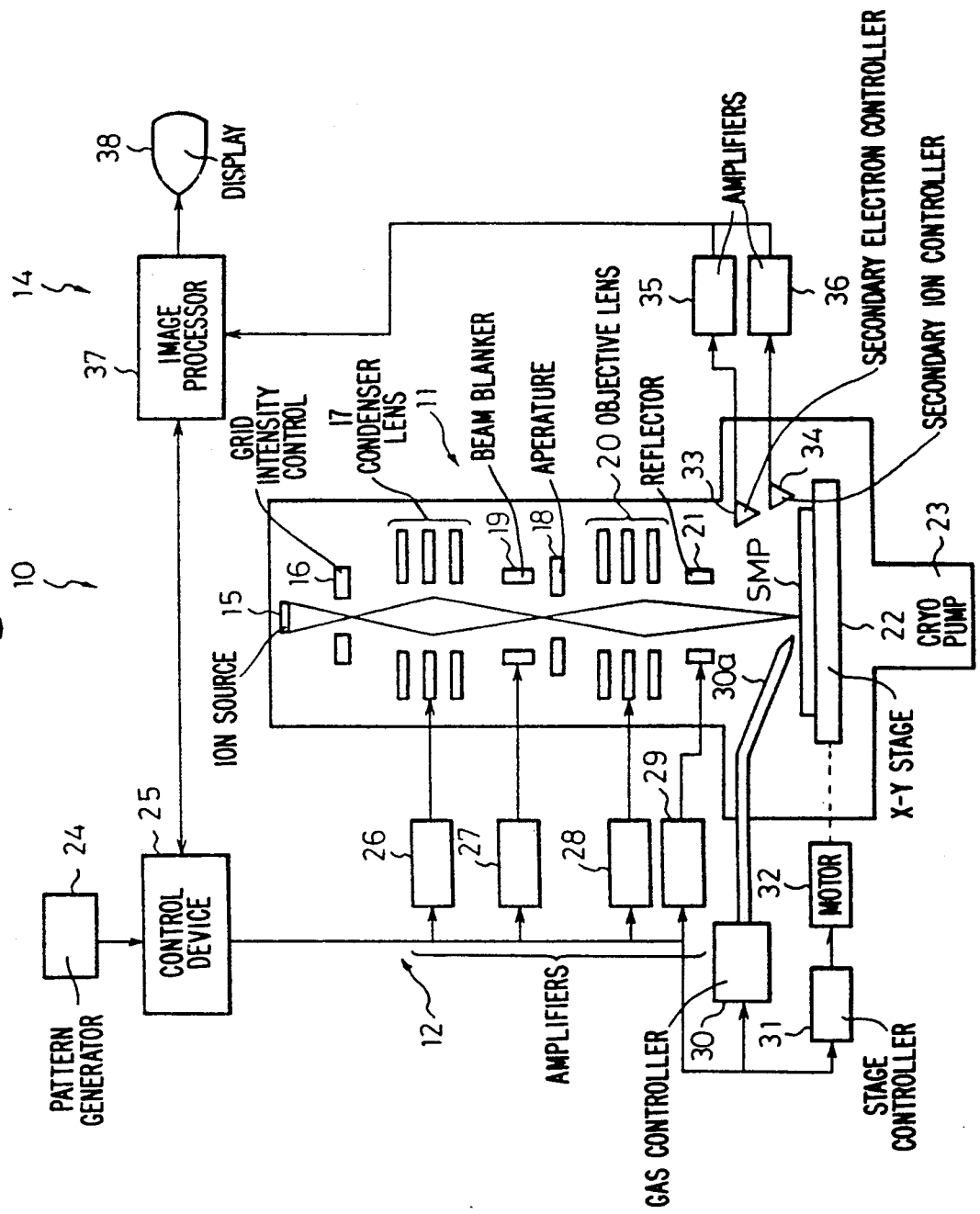
FIG. 2 is a schematical view of a focused-ion beam system.

FIG. 2 shows a focused-ion beam (FIB) system for carrying out a process according to the present invention, in which reference numeral 10 denotes an FIB system, 11 a main part thereof, 12 a control part, 13 a detection part, and 14 a display part.

Figure 1:
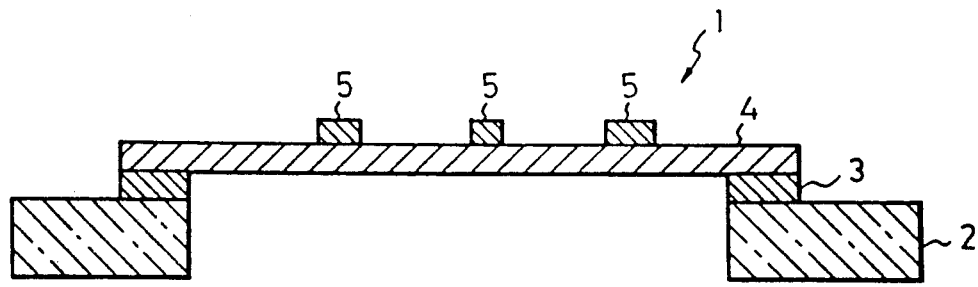
FIG. 1 is a sectional view of an X-ray mask.

The main part 11 comprises an ion source 15 for a liquid metal such as gallium, a condenser lens 17 for focusing an ion beam, a beam blanker 19 for turning the beam so that it is absorbed by an aperture 18 when the beam irradiation is not required, an objective lens 20 for focusing the beam onto a sample, for example, a membrane 4 in FIG. 1, an X-Y stage 22 capable of moving horizontally for carrying the sample, and a cryo pump 23.

The control part 12 comprises a pattern generator 24 for generating pattern data for, e.g., an X-ray mask, a control device 25 for generating various control signals in accordance with the pattern data and data representing an area whereat a pattern is to be formed, as described below, amplifiers 26 to 29 for applying voltages to the condenser lens 17, the beam blanker 19, the objective lens 20, and a reflector 21 in accordance with various control signals, a gas controller 30 for spraying a reaction gas such as $W(CO)_6$, $WF_6$ or $WCl_6$ and supplying the gas over the sample in accordance with the various signals, a stage controller 31 for generating a signal for controlling movement of the X-Y stage 22 in accordance with the various control signals, and a motor 32 for driving the X-Y stage 22 in accordance with a signal from the stage controller 31.

The detection part 13 comprises a secondary electron detector 33 having an positively charged electrode, a secondary ion detector 34 having a negatively charged electrode, and amplifiers 35 and 36 for amplifying signals detected by the secondary electron detector 33 and the secondary ion detector 34, and detects an area whereat a pattern is to be formed on the sample by discriminating differences of the secondary electron and the secondary ion emitted from the pattern of heavy metal, etc., and the membrane of boron nitride on the sample.

The display part 14 comprises an image processor 37 for sending a signal representing the pattern-forming area detected by the detection part 13 to the control device 25 and for making a graph of the pattern data and the pattern-forming pattern from the control device 25, and a display device 38 for displaying the data graph.

FIGS. 3A to 3D illustrate steps for forming an L-shaped pattern, for example, the pattern of an X-ray absorbing material for an X-ray mask.

Figure 3A:
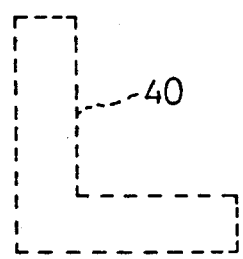
FIGS. 3A to 3D show steps of forming a pattern by ion beam assisted deposition.
Figure 3B:
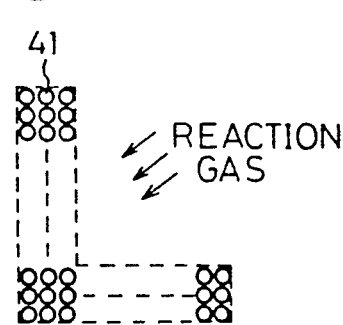
Figure 3C:
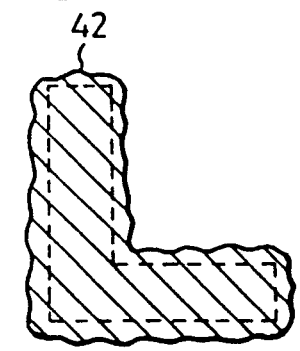
Figure 3D:
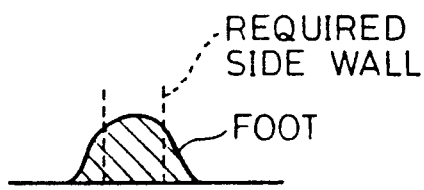

The pattern generator 24 produces a pattern data for an L-shaped pattern 40 as shown in FIG. 3A. The control device 25 produces various signals in accordance with the pattern data and controls the operations described below. Namely, the control device 25 operates the gas controller 30 to supply a reaction gas over a sample and controls the ion beam 41 to scan the pattern 40 as shown in FIG. 3B, and as a result, an X-ray absorbing material is deposited over the sample (i.e., the membrane 4 in FIG. 1) as a pattern 42 as shown in FIG. 3C. The deposited X-ray absorbing material pattern 42 has a cross-sectional shape having a gradual slope or foot, as shown in FIG. 3D. Namely, the pattern 42 has a low aspect ratio such that it is not suitable for use as an X-ray mask.

Figure 4A:
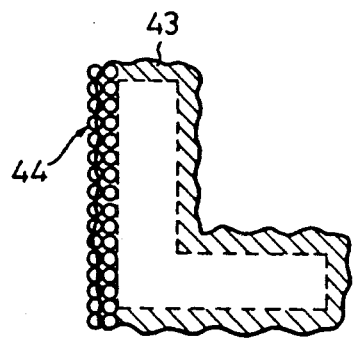
FIGS. 4A to 4C show steps of removal unwanted features of the pattern formed in FIGS. 3A to 3D.
Figure 4B:
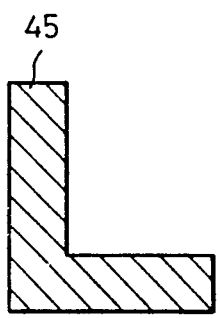
Figure 4C:
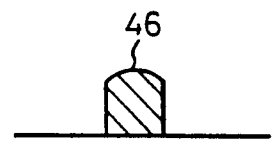

FIGS. 4A to 4C illustrate succeeding steps of peripheral brushing.

Generally, if an ion beam is irradiated on an object for a certain time, the irradiated object can be processed or worked, for example, pierced, and by making the irradiation time short, the physical effects on the object can be reduced. Based on the above, the time during which an ion beam is irradiated onto an object is selected in accordance with a desired result, i.e., whether or not the object should be worked. Note, a reaction gas is not supplied during these and the following steps.

First, an ion beam is scanned to the pattern 40 and periphery thereof at a relatively high speed, i.e., for a short irradiation time. Accordingly, the deposited portion of heavy metal or the like emits a relatively large amount of secondary electrons and secondary ions, and the other portion where the heavy metal or the like is not deposited and the membrane is exposed emits a small amount of the secondary electrons and the secondary ions. As a result, by detecting the difference in the amounts of secondary electrons and the secondary ions, the existence or non-existence of a deposit is determined at each location whereat an ion beam is irradiated, and the area of the deposited pattern 42 shown in FIG. 3C is acquired. It should be noted that an ion beam should be irradiated onto the entire periphery of a pattern to attain a desired pattern.

Second, the acquired pattern area is compared with the data for a pattern 40 to be formed, to detect an excess portion 43 of the deposit 42. An ion beam 44 is selectively irradiated onto this excess portion 43, as shown in FIG. 4A, to remove the irradiated deposit. The irradiation time is such that the deposit is removed by a thickness of less than 200 nm, preferably 50 to 100 nm, per each irradiation step or interval, so that membrane is not disadvantageously affected or damaged.

The above detection of an excess portion of the deposit and removal of the deposit from the excess portion thereof at a certain thickness are repeated, to completely remove the excess peripheral portion 43 of the deposit 42 and to obtain a desired pattern 45, as shown in FIG. 4B, having a desired cross section 46, i.e., a high aspect ratio, as shown in FIG. 4C.

Thus, in the above example, in an FIB system, a pattern is once formed by ion beam assisted deposition; an ion beam is then scanned near the deposited pattern to detect an excess peripheral portion or a foot of the deposit; and the excess portion is removed by a further irradiation of an ion beam. Therefore, the final pattern formed will have a fine pattern in accordance only with a small diameter of an ion beam, and will be suitable for use as an X-ray mask, i.e., well have a high aspect ratio.

In accordance with a process of the present invention, a fine pattern having, for example, a height of 400 to 2000 nm and a width of 200 to 500 nm with an aspect ratio of 0.8 to 1.0, can be accurately formed and an undesirable foot of the pattern can be eliminated.

The present invention also can be applied to opaque and clear repairs, or the removal of unwanted features and a replacement of missing features, in the formation of a mask, since the formation of a pattern and brushing of the periphery of the pattern can be successively carried out in the process of the present invention.

FIG. 5A to 5I illustrate the steps for a clear repair or replacement of missing features of a pattern, for example, an X-ray mask pattern.

Figure 5A:
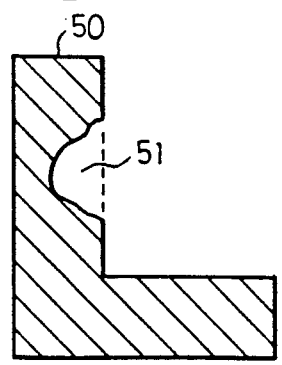
FIGS. 5A to 5I show steps of clear repair or replacement of missing features of a pattern.
Figure 5B:
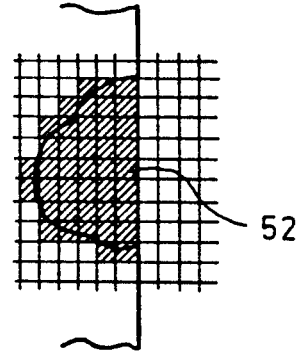

Referring to FIG. 5A, an L-shaped pattern 50 having a missing feature 51 is scanned by an ion beam to detect an image of the missing feature 51. Namely, a portion of the pattern 50 including the missing feature 51 is divided into small squares 52 having a side length approximately equal to a diameter of an ion beam (e.g., 0.2 μm) and an ion beam is irradiated to each square 52 to detect the amounts of emitted secondary electrons and ions. As described before, the amounts of the secondary electrons and secondary ions emitted from the pattern of a heavy metal or the like are high and those emitted from the area of the missing feature or exposed membrane will be low. By comparing the data of this difference of the emitted amounts of the secondary electrons and secondary ions with the data for a pattern to be formed supplied from the pattern generator 24 in each square 52, the area of the missing feature can be detected.

Figure 5C:
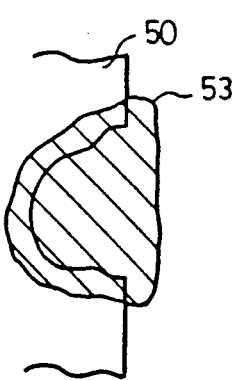

An ion beam is scanned to this detected area of the missing features while flowing a reaction gas over this area of the sample to deposit a heavy metal or the like on the irradiated area or the area of the missing feature. FIG. 5C shows a pattern 53 of this deposit.

Figure 5D:
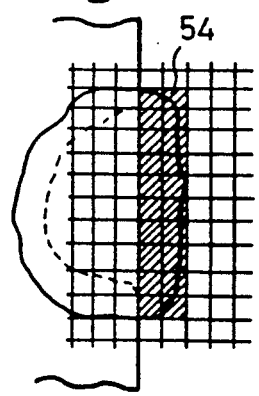
Figure 5E:
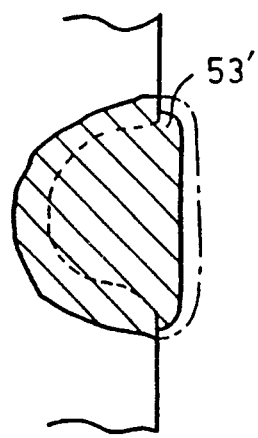
Figure 5F:
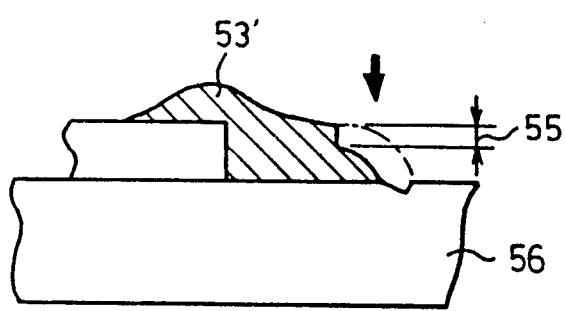
Figure 5G:
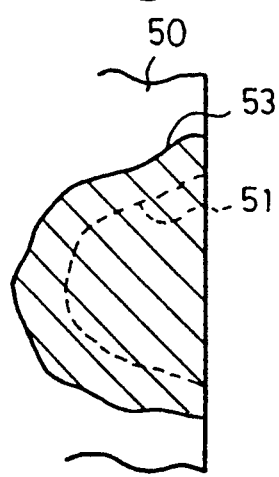
Figure 5H:
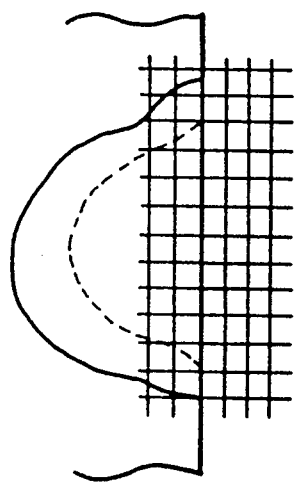
Figure 5I:
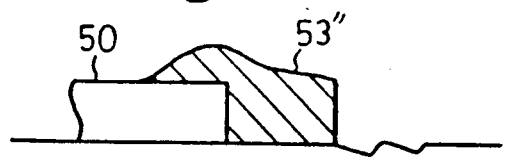

After stopping the flow of reaction gas, the pattern 53 deposited in an area of the previous missing feature is detected and compared with the data for a pattern to be formed. If the deposit 53 has an excess portion 54 over the desired pattern as shown in FIG. 5D, the excess portion of the pattern is removed by irradiation of an ion beam by a thickness 55 of less than 200 nm, preferably 50 to 100 nm per irradiation, as shown in FIGS. 5E and 5F. These procedures of the detection of the pattern of the deposit 53 or 53' and the removal of the deposit 53 or 53' by a certain thickness thereof are repeated, to completely remove the excess portion 54 of the deposit 53 without significant damage to the membrane 56, as shown in FIG. 5G. This complete removal of the excess portion 54 from the deposit 53 is finally detected by an ion beam as shown in FIG. 5H, and results in a pattern 50 and 53" having a sharp edge or a high aspect ratio. Thus, a very precise repair of an X-ray mask pattern can be carried out.

The process according to the present invention is also applicable to an opaque repair or the removal of unwanted features in a manner similar to those of the clear repair or replacement of a missing feature. The procedures for the opaque repair are very similar to those shown in FIGS. 5C to 5I.

Figure 6A:
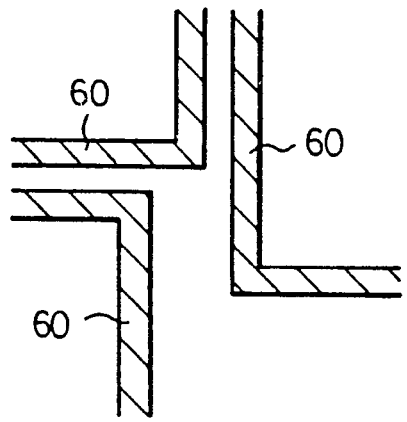
FIGS. 6A to 6B show the steps of modification of the wiring of an integrated circuit.
Figure 6B:
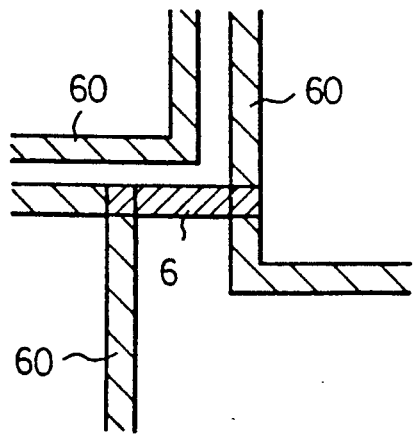

The process according to the present invention is further applicable to a modification of the wiring of an integrated circuit wherein the wiring has a high aspect ratio. For example, in some cases, it may be useful or necessary to add an additional wiring pattern to the wiring 60 of an integrated circuit as shown in FIG. 6A. FIG. 6B shows such an additional wiring pattern 61 of the integrated circuit having the wiring 60. The formation of this additional wiring pattern 61 can be advantageously carried out by the process of the present invention, particularly when the additional wiring pattern must have a high aspect ratio, or, a large space does not exist between the wiring patterns whereat the additional wiring pattern is to be formed.

I claim:

1. A process for forming a desired, fine pattern by a focused-ion beam (FIB) system, comprising the steps of:
   (A) mounting a sample in the FIB system;
   (b) scanning an ion beam on the sample while supplying a reaction gas over the sample at a first scanning condition to deposit a material from the reaction gas onto the sample, the deposited material forming a first pattern including material in excess of the desired pattern and forming a sloped foot about the periphery of the desired fine pattern; and
   (C) repeatedly performing a cycle comprising the following steps until the desired, fine pattern without a sloped foot along the entire periphery thereof is obtained:
      (i) scanning an ion beam at least along the periphery of the first pattern at a second scanning condition to acquire an image of the first pattern;
      (ii) comparing the acquired image of the first pattern with the desired, fine pattern to detect excess material of the first pattern which should be removed; and
      (iii) scanning an ion beam onto said excess material of the first pattern at a third scanning condition to remove at least a part thereof, wherein said scanning at each of the second scanning condition and at the third scanning condition is performed along the entire periphery of the desired pattern at least once;
   wherein said steps (B) and (C) are carried out in said FIB system.

2. A process according to claim 1, wherein said sample is an X-ray mask.

3. A process according to claim 1, wherein said third scanning condition is such that said excess portion of said pattern is removed at a thickness of less than 200 nm.

4. A process according to claim 3, wherein said thickness is in a range of 50 nm to 100 nm.

5. A process according to claim 1, wherein said ion beam has a beam diameter of less than 200 nm.

6. A process according to claim 1, wherein said beam diameter is less than 100 nm.

7. A process according to claim 1, wherein said first pattern must have a width of 200 to 500 nm and a height of 400 to 2000 nm as a desired pattern.

8. A process according to claim 1, wherein said reaction gas is tungsten hexacarbonyl, tungsten hexafluoride or tungsten hexachloride and said material deposited therefrom is tungsten.

9. A process according to claim 8, wherein said sample has a substrate of and said first pattern is of tungsten.

10. A process for forming a desired, fine pattern by a focused-ion beam (FIB) system, comprising the steps of:
   (A) mounting a sample including a substrate and a first pattern on the substrate in the FIB system, the first pattern having a first portion whereat a material is to be deposited for completing the desired, fine pattern;
   (B) scanning an ion beam on the first portion while supplying a reaction gas over the sample at a first scanning condition to deposit a material from the reaction gas onto the first portion of the sample, the deposited material forming a second pattern together with the first pattern and the second pattern including material which is in excess of the material required to be deposited on the first portion for completing the desired, fine pattern and which forms a sloped foot; and (C) repeatedly performing a cycle comprising the following steps until the desired, fine pattern without a sloped foot along the entire periphery thereof is obtained:

(i) scanning an ion beam at least along a periphery of the second pattern at a second scanning condition to acquire an image of the pattern;

(ii) comparing the acquired image of the second pattern with the desired, fine pattern to detect the excess material of the second pattern which should be removed; and (iii) scanning an ion beam onto said excess material of the second pattern at a third scanning condition to remove at least a part thereof, wherein said scanning at each of the second scanning condition and the third scanning condition is performed along the entire periphery of at least the first portion of the desired, fine pattern at least once;

wherein said steps (B) and (C) are carried out in said FIB system.

11. A process according to claim 10, wherein said sample is an X-ray mask and acid first portion of said first pattern is a defective area.

12. A process according to claim 10, wherein said sample is a semiconductor circuit and said first portion of said first pattern is a wiring to be added to the semiconductor circuit.

13. A process according to claim 10, wherein said third scanning condition is such that said excess portion of said second pattern is removed at a thickness of less than 200 nm.

14. A process according to claim 13, wherein said thickness is in a range of 50 nm to 100 nm.

15. A process according to claim 10, wherein said ion beam has a beam diameter of less than 2000 nm.

16. A process according to claim 10, wherein said beam diameter is less than 100 nm.

17. A process according to claim 10, wherein said second pattern must have a width less than 500 nm and a height of 400 to 2000 nm at least near said first portion,, as a desired pattern.

18. A process according to claim 10, wherein said reaction gas is tungsten hexacarbonyl, tungsten hexafluoride or tungsten hexachloride and said material deposited therefrom is tungsten.

19. A process according to claim 18, wherein said substrate is of silicon carbide and said first pattern is of tungsten.

20. A process for adding to a semiconductor circuit having a first wiring pattern, an additional, desired wiring pattern by a focused-ion beam (FIB) system, comprising the steps of:

(A) mounting a semiconductor circuit having a first wiring pattern in the FIB system;

(B) scanning an ion beam onto the semiconductor circuit while supplying a reaction gas over the semiconductor circuit at a first scanning condition to deposit wiring material from the reaction gas onto the semiconductor circuit, the deposited wiring material forming a second wiring pattern which is added to the first wiring pattern of the semiconductor circuit and includes material which is in excess of the additional, desired wiring pattern and which forms a sloped foot about the periphery of the additional, desired wiring pattern; and (C) repeatedly performing a cycle comprising the following steps until there remains only desired wiring pattern added to the first wiring pattern, without the sloped foot along the entire periphery thereof;

(i) scanning an ion beam at least along the periphery of the second wiring pattern at a second scanning condition to acquire an image of the second pattern;

(ii) comparing the acquired image of the second pattern with the additional, desired wiring pattern to detect excess material of the second pattern which should be removed; and (iii) scanning an ion beam onto said excess material of the second pattern at a third scanning condition to remove at least a part thereof, wherein said scanning at each of the second scanning condition and the third scanning condition is performed along the entire periphery of the desired wiring pattern at least once;

wherein said steps (B) and (C) are carried out in said FIB system.

* * * * *

UNITED STATES PATENT AND TRADEMARK OFFICE
CERTIFICATE OF CORRECTION

PATENT NO. : 5,004,927
DATED : April 2, 1991
INVENTOR(S) : NAKAGAWA

It is certified that error appears in the above-indentified patent and that said Letters Patent is hereby corrected as shown below:

Col. 3, line 1, after "removal" insert --of--;
line 41, change "an" to --a--.

Col. 4, line 59, change "well" to --will--.

Col. 5, line 3, change "FIG." to --FIGS.--.

Col. 7, line 37 (claim 15), change "2000 nm" to --200 nm--;
line 43, change ",," to --,--.

Signed and Sealed this

Twenty-ninth Day of June, 1993

Attest:

MICHAEL K. KIRK

Attesting Officer  Acting Commissioner of Patents and Trademarks